US008308874B1

(12) United States Patent  (10) Patent No.: US 8,308,874 B1
Clark et al.  (45) Date of Patent: Nov. 13, 2012

(54) MAGNETOSTRICTIVE MATERIALS, DEVICES AND METHODS USING HIGH MAGNETOSTRICTION, HIGH STRENGTH FEGA AND FEBE ALLOYS

(75) Inventors: Arthur E. Clark, Adelphi, MD (US); Marilyn Wun-Fogle, Potomac, MD (US); James B. Restorff, College Park, MD (US); Thomas A. Lograsso, Ames, IA (US); Rick Allen Kellogg, Tijeras, NM (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 637 days.

(21) Appl. No.: 11/296,726

(22) Filed: Nov. 29, 2005

Related U.S. Application Data

(63) Continuation-in-part of application No. 10/750,634, filed on Dec. 24, 2003, now abandoned, which is a continuation-in-part of application No. 10/182,095, filed as application No. PCT/US01/02795 on Jan. 29, 2001, now abandoned, application No. 11/296,726, which is a continuation-in-part of application No. 11/007,953, filed on Dec. 7, 2004, now abandoned, which is a continuation of application No. 10/182,095, filed as application No. PCT/US01/02795 on Jan. 29, 2001, now abandoned.

(51) Int. Cl.
 *H01F 1/147* (2006.01)
(52) U.S. Cl. .................. 148/306; 420/103; 310/26
(58) Field of Classification Search .......... None
 See application file for complete search history.

(56) References Cited

U.S. PATENT DOCUMENTS

| | | |
|---|---|---|
| 3,336,154 A | 8/1967 | Oberg et al. |
| 3,638,153 A | 1/1972 | Sparrow |
| 3,774,134 A | 11/1973 | Kardashian et al. |
| 3,833,431 A | 9/1974 | Foster et al. |
| 3,892,118 A | 7/1975 | Wiegand |
| 3,961,297 A | 6/1976 | Garshelis |
| 4,053,333 A | 10/1977 | Egami et al. |
| 4,748,000 A | 5/1988 | Hayashi et al. |

(Continued)

OTHER PUBLICATIONS

P. Mungsantisuk,"Magnetostrictive and Texture Development in Binary and Ternary FeGa-Based alloy", Ph.D. Dissertation, University of Utah, Salt Lake City, Utah May 2005.*

(Continued)

*Primary Examiner* — John Sheehan
(74) *Attorney, Agent, or Firm* — Dave A. Ghatt; Jane Barrow

(57) ABSTRACT

An alloy comprising:
 a magnetostrictive iron alloy having the formula:

$Fe_xGa_yAl_z$, where x is of from about 65 at % to about 90 at %,
  y is of from about 5 at % to about 35 at %, and
  z is of from about 0 at % to about 30 at %; and
 wherein said alloy has a room temperature magnetostriction of at least approximately 150 ppm.

An alloy having a saturated magnetostriction of from about at least 150 ppm comprising:
 a magnetostrictive iron alloy having the formula:

$Fe_xGa_yBe_t$, where x is of from about 65 at % to about 90 at %,
  y is of from about 1 at % to about 35 at %, and
  t is of from about 1 at % to about 30 at %; and
 wherein said alloy has a room temperature magnetostriction of at least approximately 150 ppm.

6 Claims, 7 Drawing Sheets

U.S. PATENT DOCUMENTS

| | | | |
|---|---|---|---|
| 4,894,615 | A | 1/1990 | Mermelstein |
| 4,904,543 | A | 2/1990 | Sakakima et al. |
| 5,305,075 | A | 4/1994 | Bucholtz et al. |
| 5,449,418 | A | 9/1995 | Takagi et al. |
| 5,493,921 | A | 2/1996 | Alasafi et al. |
| 5,600,329 | A | 2/1997 | Brenner |
| 5,706,572 | A | 1/1998 | Garsheilis |
| 5,958,154 | A | 9/1999 | O'Handley et al. |
| 5,993,565 | A | 11/1999 | Pinkerton et al. |
| 6,139,648 | A | 10/2000 | Wun-Fogle et al. |
| 6,176,943 | B1 | 1/2001 | Wun-Fogle et al. |
| 7,597,010 | B1 | 10/2009 | Clark et al. |
| 2003/0010405 | A1* | 1/2003 | Clark et al. .......... 148/108 |

OTHER PUBLICATIONS

N. Srisukhumbowornchai, "Development of Highly Magnetostrictive Fe-Ga and Fe-Ga-Al Alloys", Ph.D. Dissertation, University of Utah, Salt Lake City, Utah Aug. 2001.*

U.S. Appl. No. 60/543,650, filed Feb. 12, 2004, entitled "Preparation of Positive Magnetostrictive Materials for Operation under Tension," joint inventors Arthur E. Clark, James B. Restorff and Marilyn Wun-Fogle.

U.S. Appl. No. 11/274,635, filed Nov. 15, 2005, entitled "Method of Achieving High Transduction Under Tension or Compression," joint inventors Arthur E. Clark, James B. Restorff and Marilyn Wun-Fogle.

U.S. Appl. No. 60/882,259, filed Dec. 28, 2006, entitled "Fe-X (X=Ga,Al) Bimetallic Strips for Energy Harvesting, Actuation and Sensing" joint inventors Arthur E. Clark, James B. Restorff and Marilyhn Wun-Fogle.

U.S. Appl. No. 11/822,778, filed Jul. 10, 2007, entitled "Galfenol Steel," joint inventors Arthur E. Clark, Thomas A. Lograsso, and Marilyn Wu-Fogle.

"Tensile Properties of Magnetostrictive Iron-Gallium Alloys," R. A. Kellogg, A. M. Russell, T. A. Lograsso, A. B. Flatau, A. E. Clark and M. Wun-Fogle, *Acta Materialia*, vol. 52, pp. 5043-5050 (available online Aug. 25, 2004 at www.sciencedirect.com).

"Magnetostriction of Stress Annealed Fe-Ga-Al and Fe-Ga Alloys under Compressive and Tensile Stress," M. Wun-Fogle, J. B. Restorff, and A. E. Clark, SPIE Eleventh Annual International Symposium on Smart Structures and Materials, Mar. 14-18, 2004, San Diego, California, *Proceedings of SPIE*, vol. 5387, pp. 468-475 (Jul. 2004; published online Nov. 9, 2004).

"Magnetostriction and Elasticity of Body Centered Cubic $Fe_{100-x}Be_x$ Alloys," A. E. Clark, M. Wun-Fogle, J. B. Restorff, T. A. Lograsso, and G. Petculescu, *Journal of Applied Physics*, vol. 95, No. 11, pp. 6942-6944 (Jun. 1, 2004).

"Temperature Dependence of the Magnetic Anisotropy and Magnetostriction of $Fe_{100-x}Ga_x$ (x=8.6, 16,6, 28.5)," A. E. Clark, M. Wun-Fogle, J. B. Restorff, K. W. Dennis, T. A. Lograsso, and R. W. McCallum, *Journal of Applied Physics*, vol. 97, issue 10, pp. 10M316-1 to 10M316-3 (published online May 16, 2005).

"Tensile Strength and Non-axial Auxetic Properties of Fe-Ga Alloys, R.A. Kellogg, A.M. Russell," T.A. Lograsso, A.B. Flatau, A.E. Clark, and M. Wun-Fogle, U.S. Navy Workshop on Acoustic Tranduction Materials and Devices, State college, PA, May 6-8, 2003.

Cullen, J.R., Clark, A.E., Wun-Fogle, M., Restorff, J.B., and Lograsso, T.A., "Magnetoelasticity of Fe-Ga and Fe-Al Alloys", Journal of Magnetism and Magnetic Materials 226-230 (2001) 948-949.

Clark, A.E., Wun-Fogle, M., Restorff, J.B., Lograsso, T.A. and Petculescu, G. "Magnetostriction and Elasticity of b.c.c. Fe100-xBex Alloys", 9th Joint MMM-Intermag Conference, Jan. 5-9, 2004, Abstract Designation EC-03.

N. Srisukhumbowornchai and S. Guruswamy, "Large Magnetostrictive in Directionally Solidified FeGa and FeGaAl Alloys", J. Appl. Phys., vol. 90, No. 11 Dec. 1, 2001, pp. 5680-5688. (Accepted Aug. 25, 2001 Published Dec. 2001).

Kawamiya, Nobuo, Adachi, Kengo and Nakamura, Yoji, Journal of the Physical Society of Japan., vol. 33, No. 5, Nov. 1972 pp. 1318-1327.

Kellogg, R.A., Flatau, A.B., Clark, A.E., Wun-Fogle, M. and Lograsso, T.A., "Temperature and Stress Dependencies of the Magnetic and Magnetostrictive Properties of Fe0.81Ga.19", Journal of Applied Physics, vol. 11, No. 10, May 15, 2002, pp. 7821-7823.

Clark, Arthur E., Wun-Fogle, Marilyn, Restorff, James B. and Lograsso, Thomas A., "Magnetostrictive Properties of Galfenol Alloys Under Compressive Stress", Materials Transactions, vol. 43, No. 5 (2002) pp. 881-886.

Restorff, J.B., Wun-Fogle, M., Clark, A.E., Lograsso, T.A., Ross, A.R. and Schlagel, D.L., "Magnetostriction of Ternary Fe-Ga-X Alloys (X=Ni,Mo,Sn,Al)", Journal of Applied Physics, vol. 91, No. 10, May 15, 2002, pp. 8225-8227.

Guruswamy, S. Srisukhumbowornchai, N., Clark, A.E., Restorff, J.B., and Wun-Fogle, M., "Strong, Ductile, and Low-Field-Magnetostrictive Alloys Based on Fe-Ga", Scripta Mater, 43, pp. 239-244, (2000).

Clark, A.E., Restorff, J.B., Wun-Fogle, M. and Lograsso, T.A. "Magnetostriction Properties of Fe-Ga Alloys Under Large Compressive Stresses", The 2000 IEEE International Magnetics Conference, Digest Intermag 2000, BS-12, Apr. 8, 2000 2 pages.

Clark, A.E., Wun-Fogle, M., Restorff, J.B., Lograsso, T.A. and Schlagel, D.L., Magnetostrictive Galfeno/Alfenol Single Crystal Alloys Under Large Compressive Stresses, Actuator 2000, 7th International Conference on New Actuators, Jun. 18, 2000, pp. 111-115.

H. Okamoto, Phase Diagrams of Binary Iron Alloys, ASM International, Materials Park, OH, pp. 147-151, (1993).

H. Okamoto and L.E. Tanner, "Phase Diagrams of Binary Beryllium Alloys", ASM International Metals Park, Ohio, pp. 81-96.

Cheng, S.F., Das, B.N., Wun-Fogle, M, Lubitz, P., and Clark, A.E., "Structure of Melt-Spin Fe-Ga Based Magnetostrictive Alloys", Paper # AE06, Intermag Europe 2002, Apr. 28-May 2, 2002 Amsterdam, The Netherlands, pp. 1-3.

Lograsso, T.A., Ross, A.R., Schlagel, D.L., Clark, A.E., Wun-Fogle, M.., "Structural Transformations in Quenched Fe-Ga Alloys", Journal of Alloys and Compounds 350 (2003) pp. 95-101.

Clark, A.E., Hathaway, K.B., Wun-Fogle, M., Restorff, J.B., Lograsso, T.A,, Keppens, V.M., Petculescu, G. and Taylor, R.A., "Extraordinary Magnetoelasticity and Lattice Softening in bcc Fe-Ga Alloys", Journal of Applied Physics, vol. 93, No. 10, May 15, 2003, pp. 8621-8623.

Kellogg, R.A., Flatau, A.B., Clark A.E, Wun-Fogle, M., and Lograsso, T.A. "Texture and Grain Morphology Dependencies of Saturation Magnetostriction in Rolled Polycrystalline Fe836a17", Journal of Applied Physics, vol. 93, No. 10, May 15, 2003, pp. 8495-8497.

Restorff , J.B., Wun-Fogle, M., Clark, A.E., Lograsso, T.A., Ross, A.R. and Schlagel, D.L., "Magnetostriction and Magnetization of Ternary Fe-Ga-X Alloys (X=Sn,Ni,Mo)", Abstracts, 46th Conference on Magnetism & Magnetic Materials, Seattle, Washington, Nov. 12-16, 2001, pp. 274-275.

Clark, Arthur E., Restorff, James B., Wun-Fogle, Marilyn, Lograsso,Thomas A. and Schlagel, Deborah L., "Magnetostrictive Properties of Body-Centered Cubic Fe-Ga and Fe-Ga-al Alloys", IEEE Transactions on Magnetics, vol. 36, No. 5, Sep. 2000, pp. 3238-3240.

Kellogg. R.A., Russell, A.M., Lograsso, T.A., Flatau, A.B.,Clark, A.E. and Wun-Fogle, M., "Mechanical Properties of Magnetostrictive Iron-Gallium Alloys", SPIE's 10th Annual International Symposium on Smart Structures and Materials, Mar. 2-6, 2003, paper#5053-70.

Clark, Arthur E., Wun-Fogle, Marilyn, Restorff, James B., Lograsso, Thomas A. and Schlagel, Deborah L., "Magnetostricive Alfenol/ Galfenol Alloys Under Large Compressive Stresses", Presentation, Actuator 2000, Jun. 19-21, 2000, 17 pages.

Clark, Arthur E, Wun-Fogle, Marilyn, Restorff, James B., Lograsso, Thomas A. and Cullen, James R., "Effect of Quenching on the Magnetostriction of Fe1-xGax(0.13 <x< 0.21)", IEEE Transactions on Magnetics, vol. 37 No. 4, Jul. 2001, pp. 2678-2680.

Clark, Arthur E., Wun-Fogle, Marilyn, Restorff, James B., Lograsso, Thomas A., Ross, Amy R. and Cullen, James R., "Effect of Quenching on the Magnetostriction of Fe1-xGax", The 8th Joint MMM-Intermag Conference, Jan. 7, 2001, p. 284.

Clark, Arthur E, Wun-Fogle, Marilyn, Restorff, James B., Lograsso, Thomas A., Ross, Amy R. and Cullen, James R., "Effect of Quenching on the Magnetostriction of Fe1-xGax", The 8th Joint MMM-Intermag Conference, Presentation, Jan. 7-11, 2001, 15 pages.

Gersdorf, Robert, "On Magnetostriction of Single Crystals of Iron and Some Dilute Iron Alloys", PhD. Thesis, Universiteit van Amsterdam, Nov. 22, 1961.

Kellogg, Rick A., Flatau, Alison, Clark, Arthur E.. Wun-Fogle, Marilyn and Lograsso, Thomas, "Ouasi-Static Transduction Characterization of Galfenol", 2003 ASME International Mechanical Engineering Congress & Exposition, Nov. 16-21, 2003, Washington, D.C., pp. 1-8.

Viehland, D., Li, J.F. Lograsso, T.A., Ross, A., Wuttig, Manfred, "Structural Studies of Fe0.81Ga0.19 by reciprocal Space Mapping", Applied Physics Letters, vol. 81, No. 17, Oct. 21, 2002 pp. 3185-3187.

Dai, Liyang, Cullen, James, Wuttig, Manfred, Lograsso, T., Quandt, Eckhard, "Magnetism, Elasticity, and Magnetostriction of FeCoGa Alloys", Journal of Applied Physics, vol. 93, No. 10, May 15, 2003, pp. 8627-8629.

Srisukhumbowornchai, N. and Guruswamy S., Abstract "Influence of Ordering on the Magnetostriction of Fe-27.5 at % Ga Alloys", Internet Search, 2 pages, Abstract of Article Published Nov. 1, 2002.

Kellogg, R.A., Flatau, A.B., Clark, A.E., Wun-Fogle, M. and Lograsso, T.A., Abstract "Texture and Grain Morphology Dependencies of Saturation Magnetostriction in Rolled Polycrystalline Fe83Ga17", Internet search, 2 pages, May 2003.

Clark, Arthur E., Wun-Fogle, Marilyn, Restorff, James B., Lograsso, Thomas A. and Petculescu, Gabriella, "Magnetostriction and Elasticity of b.c.c. Fe100-xBex Alloys", Presentation, The 9th Joint MMM-Intermag Conference Jan. 5-9, 2004, 13 pages.

Office Action of Parent U.S. Appl. No. 10/182,095, date mailed Aug. 25, 2003, 12 pages.

PCT International Preliminary Examination Report, File Copy 409, PCT/US01/02795, 10 pages.

PCT International Search Report, File Copy 210, PCT/US01/02795, 7 pages.

Kellogg, Rick Allen, "Development and Modeling of Iron-Gallium Alloys", PhD. Thesis, Iowa State University, Ames, Iowa (2003).

Restorff, J.B., Wun-Fogle, M and Clark, A.E. "High Magnetomechanical Coupling of Transduction Elements Under Tension", 11th CF/DRDC International Meeting on Naval Application of Materials Technology, Darmouth, Nova Scotia Jun. 7-9, 2005 5 pages.

U.S. Appl. No. 11/053,753, filed Jan. 31, 2005, entitled "High Magnetostriction of Positive Magnetostrictive Materials under Tensile Load," joint inventors Arthur E. Clark, James B. Restorff and Marilyn Wun-Fogle.

International Application published under the Patent Cooperation Treaty (PCT), International Publication No. WO 01/55687 A2, International Application No. PCT/US01/02795, international filing date Jan. 29, 2001, title "Magnetostrictive Devices and Methods using High Magnetostriction, High Strength FeGa Alloys," joint inventors Arthur E. Clark et al.

Arthur E. Clark, James B. Restorff, Marilyn Wun-Fogle, Thomas A. Lograsso and Deborah L. Schlagel, "Magnetostrictive Properties of b.c.c. Fe-Ga and Fe-Ga-Al Single Crystals," Apr. 10, 2000, Poster Presentation, Intermag 2000, 17 pages.

T.A. Lograsso, D.L. Schlagel and A.R. Ross, "Influence of Crystal Chemistry on Magnetoelastic Properties in Fe-Ga A1," no earlier than May 2002, Internet search, 3 pages.

* cited by examiner

MAGNETOSTRICTIVE MATERIALS, DEVICES AND METHODS USING HIGH MAGNETOSTRICTION, HIGH STRENGTH FEGA AND FEBE ALLOYS

This application is a continuation-in-part of U.S. patent application Ser. No. 10/750,634 filed Dec. 24, 2003, entitled "Magnetostrictive Materials, Devices and Methods Using High Magnetostriction, High Strength FeGa and FeBe Alloys" now abandoned, which is a continuation-in-part of U.S. patent application Ser. No. 10/182,095 filed Jul. 24, 2002 entitled, "Magnetostriction Devices and Methods Using High Magnetostriction, High Strength, FeGa Alloys," now abandoned, which was the National Stage of International Application No. PCT/US01/02795 filed Jan. 29, 2001, entitled "Magnetostrictive Devices and Methods Using High Magnetostriction, High Strength Alloys", and this application is also a continuation-in-part of U.S. patent application Ser. No. 11/007,953 filed Dec. 7, 2004, entitled "Magnetostrictive Devices and Methods Using High Magnetostriction, High Strength FeGa Alloys" now abandoned which is a continuation of U.S. patent application Ser. No. 10/182,095 filed Jul. 24, 2002 entitled, "Magnetostriction Devices and Methods Using High Magnetostriction, High Strength, FeGa Alloys," now abandoned, which was the National Stage of International Application No. PCT/US01/02795 filed Jan. 29, 2001, entitled "Magnetostrictive Devices and Methods Using High Magnetostriction, High Strength Alloys", each of these applications, is incorporated herein by reference.

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION

1. Field of the Invention

The present invention relates generally to magnetostrictive alloys, devices and methods and, more specifically, to magnetostrictive materials, devices and methods using rugged magnetostrictive alloys.

2. Description of the Background Art

With the emergence of smart material technology, a need has arisen for rugged, inexpensive, highly magnetostrictive materials that have the ability to transduce large energies under high compressive stresses. Common metals, such as iron, numerous iron-alloys and steels, possess good mechanical properties and the ability to withstand shock environments, but have very low magnetostrictions ($\sim 10^{-5}$ to $\sim 10^{-4}$), with many alloys having magnetostrictions near the lower value. Terfenol-D, various high magnetostriction rare earth-$Fe_2$ compounds, and single crystals of modified cobalt ferrite possess huge magnetostrictions ($>10^{-3}$) at room temperature, but are, in general, brittle and unable to withstand appreciable tensile stresses. To fill the gap between these materials, attempts have been made to synthesize magnetostrictive composites using highly magnetostrictive Co ferrite or rare earth-$Fe_2$ with some type of binder.

SUMMARY OF THE INVENTION

Accordingly, it is an object of this invention to provide a highly magnetostrictive material with good physical strength.

It is another object of this invention to provide a shock-resistant, highly magnetostrictive material.

It is a further object of the present invention to provide a highly magnetostrictive material with sufficient strength to be used as a structural member.

These and other objects of the present invention are accomplished by magnetostrictive materials, devices and methods using an Fe-based alloy having of from about 65 at % to about 90 at % Fe, about 5 at % to about 35 at % Ga, and, optionally, one or more additional non-magnetic metals, such as Al and Be, and optionally, one or more additional magnetic metals, such as Co and Ni.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DESCRIPTION OF THE PREFERRED EMBODIMENTS

The magnetostrictive alloys used in the magnetostrictive device and method of the presently claimed invention are based upon the body-centered structure and have a room temperature saturation magnetostriction along the [100] axis of at least about 150 ppm, typically about 200 ppm or more, and often about 300 or more. While not intending to be bound by theory, it appears that Ga and some other nonmagnetic metals such as Al substitute for iron in the crystal lattice, distorting the lattice and enhancing the magnetostrictive properties of the material. It appears that the distribution of the added Ga and any other nonmagnetic metal is not completely random, exhibiting some short-range order. Thus, the crystalline structure of the alloys of the present invention may be a hybrid, or perhaps even a multiphase mixture, including the α-iron phase, the $B_2$ phase, the $DO_3$ phase, and, possibly, the $L1_2$ phase.

Alloys
FeGa

The Fe-based alloys used in the present invention should include at least about 5 at % Ga in order to assure significant enhancement of magnetostrictive properties. The effects of Ga (or a mixture of Ga and an additional nonmagnetic metal, e.g., Al and/or Be, and/or magnetic metal Co and/or Ni) upon the magnetostrictive performance of the alloys according to the present invention vary closely parabolically depending upon concentration. To achieve maximum magnetostriction, the concentration of Ga should be as high as possible without introducing significant concentrations of secondary phases that lower magnetostriction. The concentration of Ga at which peak magnetostriction occurs varies depending upon how the alloys are formed. When the alloy is formed by furnace cooling a melt of Fe and Ga, a peak magnetostriction occurs at about 15-17 at % Ga. With rapid quenching rather than furnace cooling, the peak magnetostriction moves to about 19 at % Ga. A second magnetostriction peak occurs at about 27 at % Ga for both quenched and slow cooled materials.

FeGaAl

An additional nonmagnetic metal, such as Al, may substitute for some of the Ga in order to reduce cost. An acceptable amount of Al is between 5 and 15 at %.

FeBe

Figure 8:
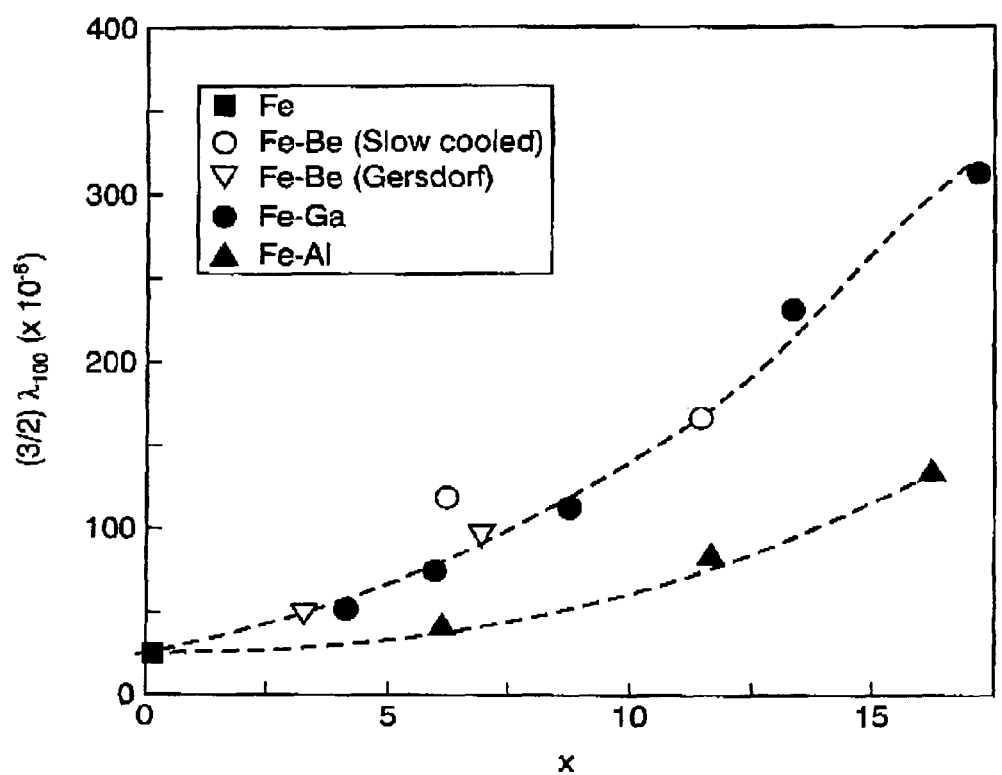
FIG. 8 shows the magnetostriction observed for Fe, FeAl, FeGa and FeBe.

An additional nonmagnetic metal, Be, may increase the magnetostriction of the Fe alloys. R. Gersdorf prepared alloys of FeBe in which the Be concentration was up to 6.8 at %. FIG. 8 shows magnetostrictions of single crystals of Fe, FeAl, FeGa and FeBe in which the atomic percent of the nonmetal, Al, Ga and Be, is between 2.5 at % and 17 at %. Be having an atomic percent of 11.3 and a magnetostriction ($3/2\lambda_{100} \times 10^{-6}$) of greater than 150 ppm and is most impressive and unexpected.

Impurties

Impurities and additives may also be present in the alloys of the present invention. These impurities and other additional metals may be present as long as they do not significantly lower the magnetostriction of the alloys. Typically, impurities and other additional metals are acceptable in amounts of 2 at % or less, and, more often, in amounts of 1 at % or less.

Devices

Figure 1:
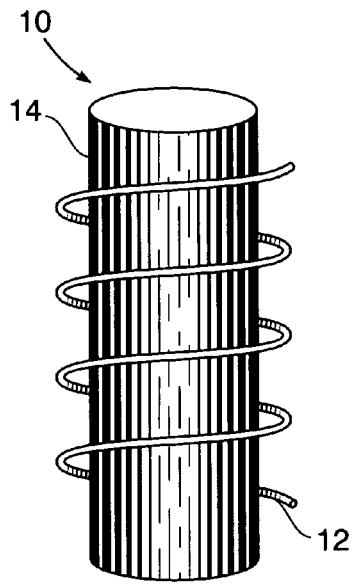
FIG. 1 schematically illustrates a typical device according to the present invention.

FIG. 1 schematically illustrates a typical device 10 according to the present invention. Electromagnetic winding 12 is coiled about core 14 of the above-described magnetostrictive alloy. The device exhibits two modes of operation. In its actuator mode, current flowing through winding 12 generates a magnetic field. This magnetic field acts upon core 14, causing dimensional changes along at least one axis thereof. In the current generating mode, force applied along an axis of core 14 changes the dimensions thereof. This change in dimensions magnetostrictively changes the magnetic field to which coil winding 12 is exposed. That changing magnetic field generates a current within winding 12. FIG. 1 does not show the additional actuator appendages, such as, springs, flux return, magnetic materials and head and tail masses.

Methods
Single Crystal Growth Method

Single crystal iron gallium alloy can be prepared using cleaned 99.99% pure electrolyte iron and gallium. Measured quantities of each metal are melted together several times in an inert, e.g., argon atmosphere. The buttons are re-melted and drop-cast into a Cu chill cast mold in order to obtain compositional homogeneity. The as-cast ingots are degassed in an alumina crucible under vacuum by heating. In an argon atmosphere, the temperature is increased to 1650° C. The ingot/crucible is stabilized for 1 hour at this temperature and then withdrawn at a rate of 2 mm/hr.-20 mm/hr. Additionally, oriented single crystals can be prepared through the use of a seed crystal properly oriented to the magnetic easy axis. The seed crystal was carefully packed into the base of the crucible and melting of the charge material was controlled in a manner that preserved the seed crystal. The seed/ingot/crucible was stabilized for 1 hour at 1650° C. and then withdrawn at a rate of 20 mm/hr.

Directional Growth Variation of Single Crystal Growth

Figure 9:
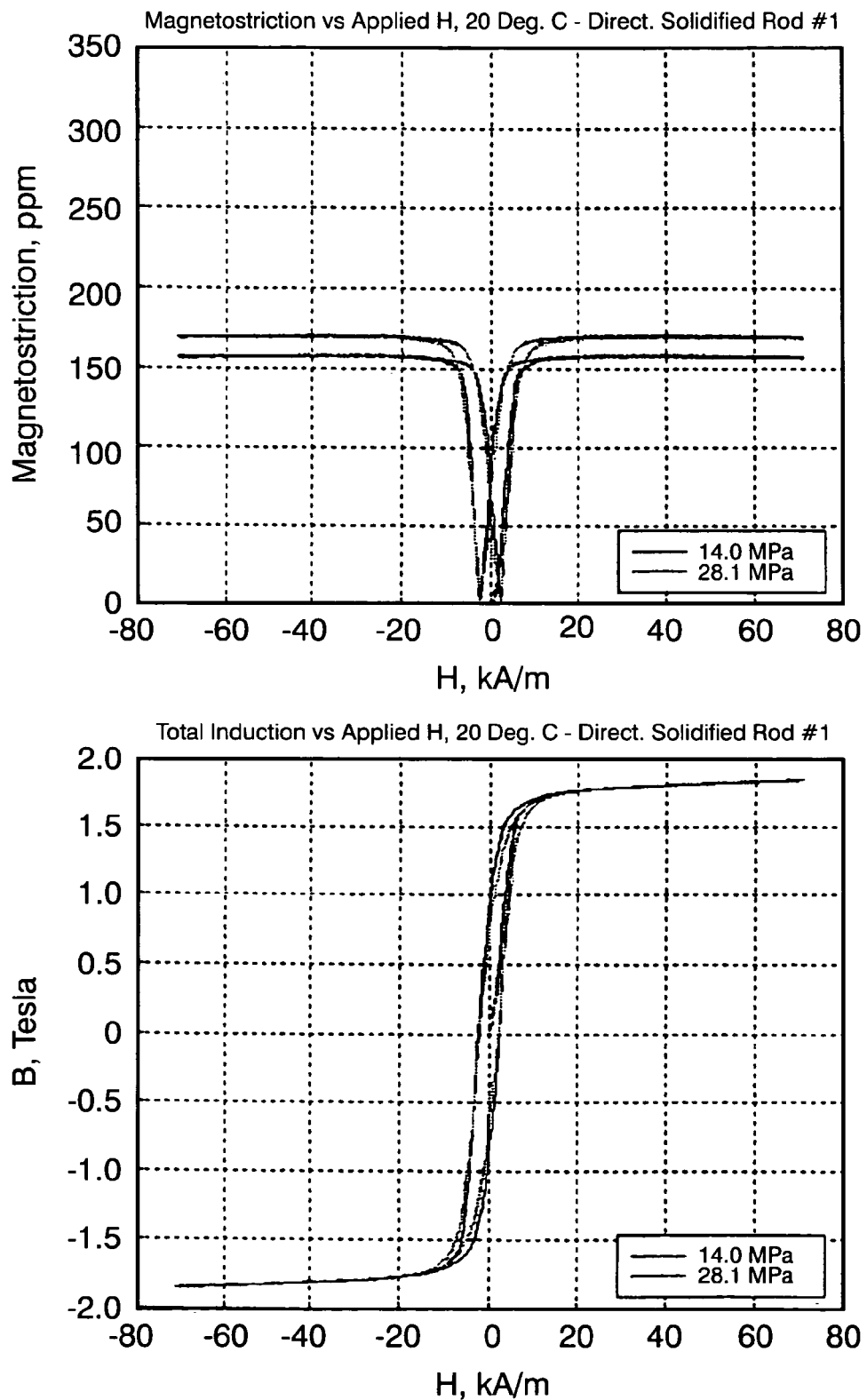
FIG. 9 shows the magnetostriction and magnetic measurements of a growth textured rod of Galfenol, $Fe_{83}Ga_{17}$.

Several different methods allow one to obtain single crystal-like polycrystalline alloys according to the present invention. For example, directional growth methods (such as the Bridgman method) typically used for single crystal growth may be modified so that crystal growth occurs at rates significantly greater than those typically used for single crystal growth. Such a method typically provides a polycrystalline material with a mixture of [100] crystallites with various orientations, and good magnetostriction. FIG. 9 shows the magnetostriction and magnetic moment of a growth textured rod of $Fe_{83}Ga_{17}$. While this method is generally faster than single crystal growth, it is generally less expensive.

Rolling Method

Preferential alignment of polycrystalline material according to the present invention, which should result in good magnetostrictive properties maybe obtained by using a sequence of hot rolling, warm rolling with intermediate anneals and extended final texture anneal. The above-described methods, single crystal growth, directional growth and hot and warm rolling of producing preferentially [100] aligned FeGa according to the present invention are further described in the EXAMPLES section of this application.

Having described the invention, the following examples are given to illustrate specific applications of the invention including the best mode now known to perform the invention. These specific examples are not intended to limit the scope of the invention described in this application.

EXAMPLES

Single Crystal Alloys

Preparation—FeGa, FeAl and FeGaAl

Measured quantities of electrolytic iron (99.99% pure), gallium (99.999% pure), and when used aluminum (99.999% pure) were cleaned and are melted together as FeGa, FeAl or FeGaAl alloys, several times under an argon atmosphere. The resulting buttons of ~40 g were re-melted and the alloy drop-cast into a Cu chill cast mold to obtain compositional homogeneity. Next, the as-cast ingot was inserted into an alumina crucible, heated under vacuum up to 600° C. for degassing. The furnace was then backfilled with argon and the temperature increased to 1650° C. The ingot/crucible was stabilized for 1 hour at this temperature and then withdrawn at a rate of 2 mm/hr.

Following crystal growth, the samples were annealed at 1000° C. for 72 hours and furnace cooled. The as-grown crystals were oriented along the [100] direction within 1 degree using back-reflection Laue diffraction and finally cut into thin discs, 3 inch diameter x ~1 inch long rods for magnetostriction, magnetization, and elastic moduli measurements.

Preparation—FeBe

Single crystals of $Fe_{93.9}Be_{6.1}$ and $Fe_{88.7}Be_{11.3}$ were prepared by Bridgman growth of arc-cast ingots of electrolytic Fe (99.99% pure) and Be (99.9% pure) in alumina crucibles. The ingots were stabilized in the crucible for 1 hr at 1600° C. and lowered at a rate of 4 mm/hr. Following growth, the ingots were heat treated at 1000° C. for 168 hr and cooled at a rate of 10° C./hr. Although the equilibrium condition of these alloys below ~700° C. contains the hexagonal $FeBe_2$ Laves phase, this phase was not present in the x-ray diffraction patterns following heat treatment. While the diffraction patterns confirmed the b.c.c. structures, the local ordering of Be and Fe on the b.c.c. lattice is not known. (100) and (110) oriented single crystal disks (~0.3 cm×0.6 cm dia) were cut from the boule by EDM machining for magnetostriction and magnetization measurements.

Magnetostriction Measurements of $\lambda_{100}$ and $\lambda_{111}$ were Obtained from 77 K to Room Temperature Using Non-Magnetoresistive Kyowa KFL-1-120-C1-11 Strain Gages.

Measurements of resistivity were made using an HP3470A in a four-wire mode. Temperature dependences of the magnetizations were obtained by using a Magnetic Instruments 7385 flux meter to measure flux changes with ~20 turn #36 gage wire coils wrapped around the alloys. Magnetostrictions were taken at a field of 15 kOe.

Magnetostriction results in FeBe alloys with Be concentrations up to 6.8% described in R. Gersdorf, Ph.D. Thesis, University of Amsterdam, The Netherlands, 1961, revealed the possibility of magnetostriction constant $\lambda_{100}$ about 99 for Fe—Be alloys. FIG. 8 compares Be concentration dependences up to 17%. Both Fe—Be and Fe—Ga alloys have comparable increases up to ~11% solute. This is somewhat surprising since Be is a smaller atom than Fe, while Ga atoms are larger than Fe.

Figure 2:
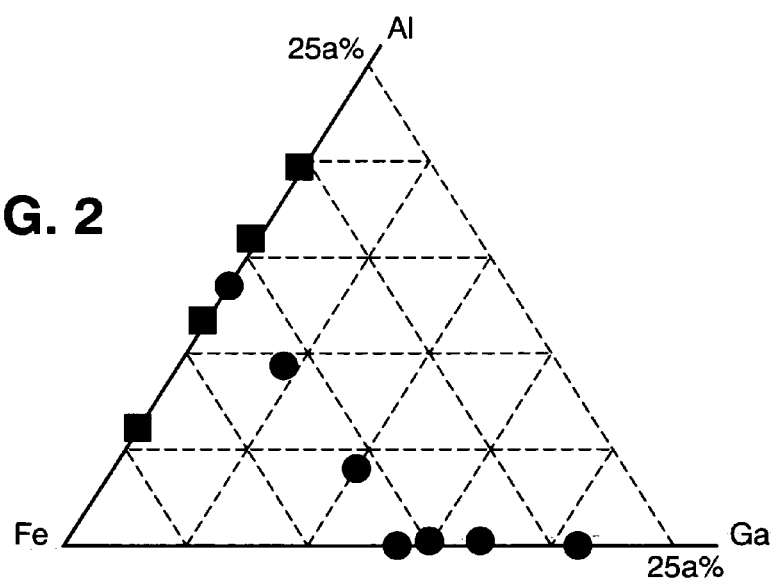
FIG. 2 is a chart showing the composition of various FeGaAl alloys. Points marked by a "•" that show single crystal compositions prepared and examined in the EXAMPLES section, and by a "☐" show prior art alloy compositions measured by Hall in *J. Appl. Phys.* 30, (1959) 816-919; and *J. Appl. Phys.* 31 (1960), 1037-1038.

Magnetostriction and Magnetization of Fe—Ga and Fe—Ga—Al Single Crystals Under Compressive Stress A conventional dead-weight apparatus was used to apply compressive loads to the samples indicated in FIG. 2, i.e., FeGa, FeAl and FeGaAl in rod form. Magnetic fields up to 1 kOe were applied to the samples from a solenoid energized by a constant current source. The magnetizations were calculated from the emf generated by a small pick-up coil surrounding the center of the sample. Displacements were determined from the output of three linear variable differential transformers (LVDT's) and two or more strain gages. Typical room temperature magnetostriction and magnetization data under compressive loads are shown in FIGS. 3, 4, and 5.

Figures 3A, 3B:
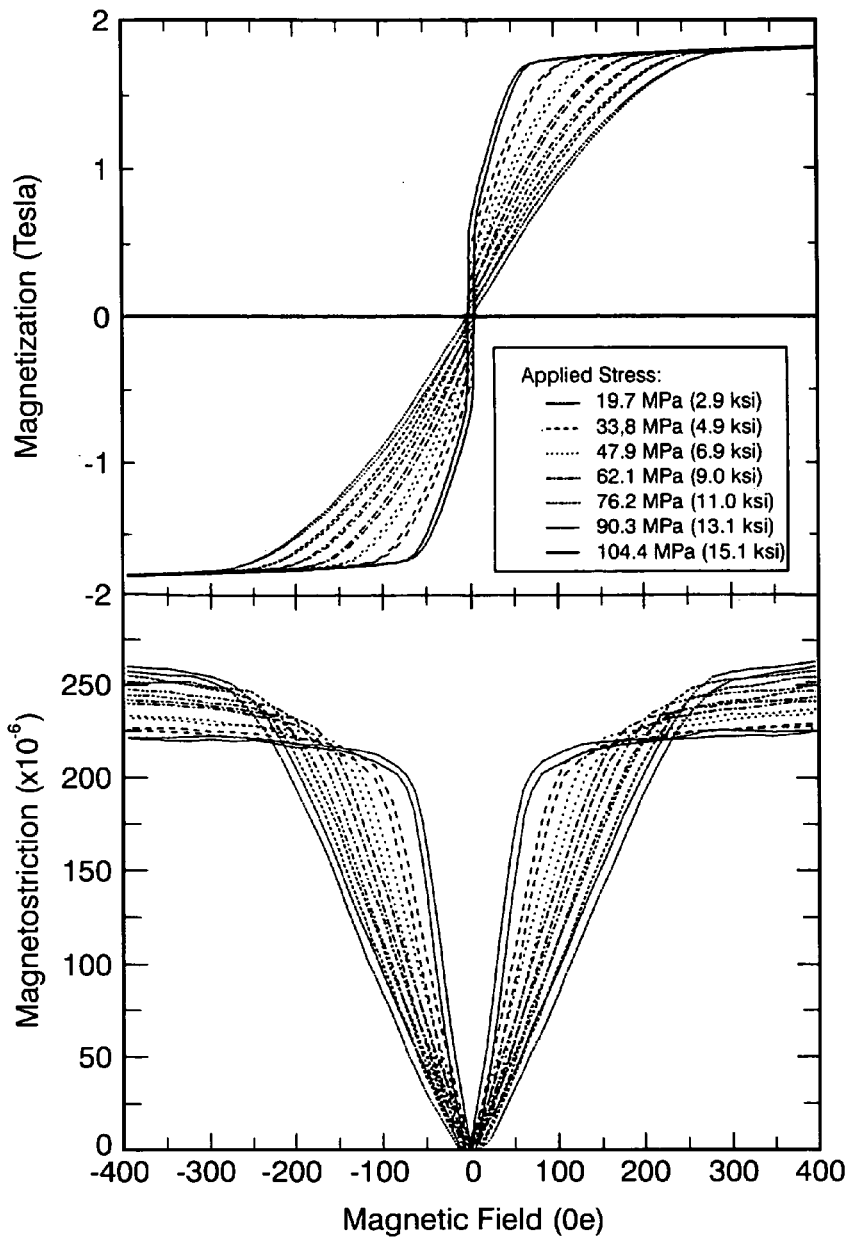
FIG. 3a and FIG. 3b show room temperature magnetostriction and magnetization, respectively, along the [100] axis of $Fe_{87}Ga_{13}$ as a function of internal magnetic field (H) for compressive loadings of 19.7 to 104.4 MPa. The internal field (H) was calculated using a demagnetization factor of N=0.0075.
Figure 4B:
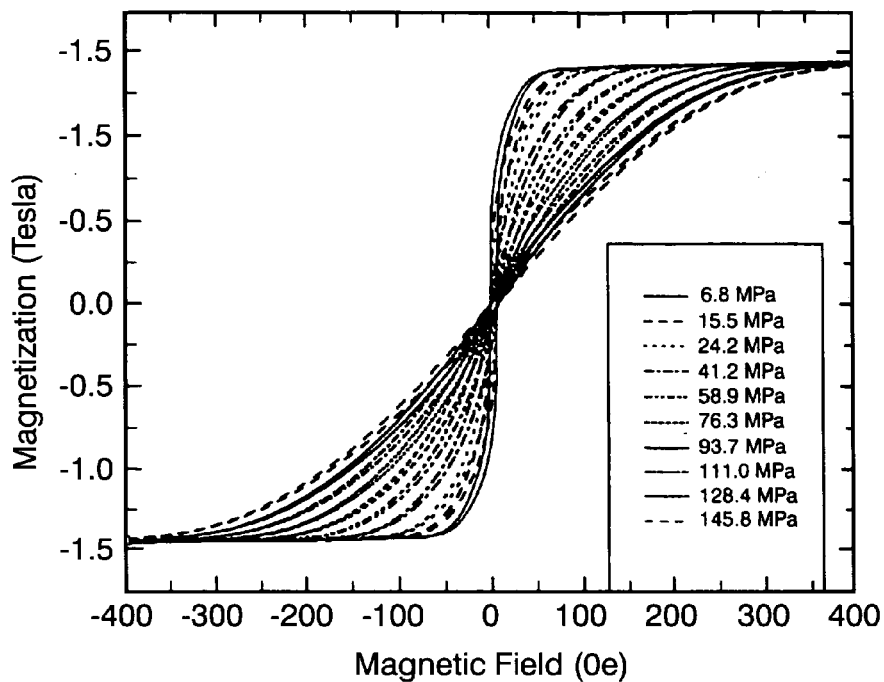
FIG. 4a and FIG. 4b show room temperature magnetostriction and magnetization, respectively, along the [100] axis of $Fe_{79}Ga_{21}$ as a function of internal magnetic field (H) for compressive loadings of 6.8 to 145.8 MPa. The internal field (H) was calculated using a demagnetization factor of N=0.0060.

FIG. 3a illustrates the fractional change in length of [100] single crystal $Fe_{87}Ga_{13}$ in fields up to 400 Oe and compressive stresses up to 104.4 MPa (magnetostriction of approximately 220 ppm, at 19.7 MPa, field of 400 Oe. The magnitude of the saturation magnetostrictions are ~10× those of Fe and ~2× those of $Fe_{85}Al_{15}$. The large saturation magnetization of ~1.8 T (FIG. 3b) helps to achieve these large magnetostrictions at readily attainable fields even under stresses greater than 104.4 MPa. In addition, the high saturation magnetization of $Fe_{100-x}Ga_x$ alloys (x<20) possess [100] easy axes, which also aids the rapid saturation of magnetostriction and magnetization.

Table I illustrates how the average values of piezomagnetic constant ($d_{33}$) and permeability ($\mu_{meas}$) for $Fe_{83}Ga_{17}$ depend upon compressive stress.

TABLE I

PIEZOMAGNETIC $d_{33}$ CONSTANT AND PERMEABILITY OF $FE_{83}GA_{17}$ UNDER COMPRESSIVE STRESS AT ROOM TEMPERATURE

| σ (MPa) | $d_{33}$ (nm/A) | $\mu_{meas}$ |
|---|---|---|
| 16.0 | 58 | 285 |
| 27.5 | 34 | 174 |
| 39.0 | 29 | 133 |
| 50.5 | 22 | 108 |
| 62.0 | 20 | 91 |
| 73.5 | 18 | 78 |
| 85.0 | 16 | 70 |
| 96.5 | 15 | 61 |

Figure 4A:
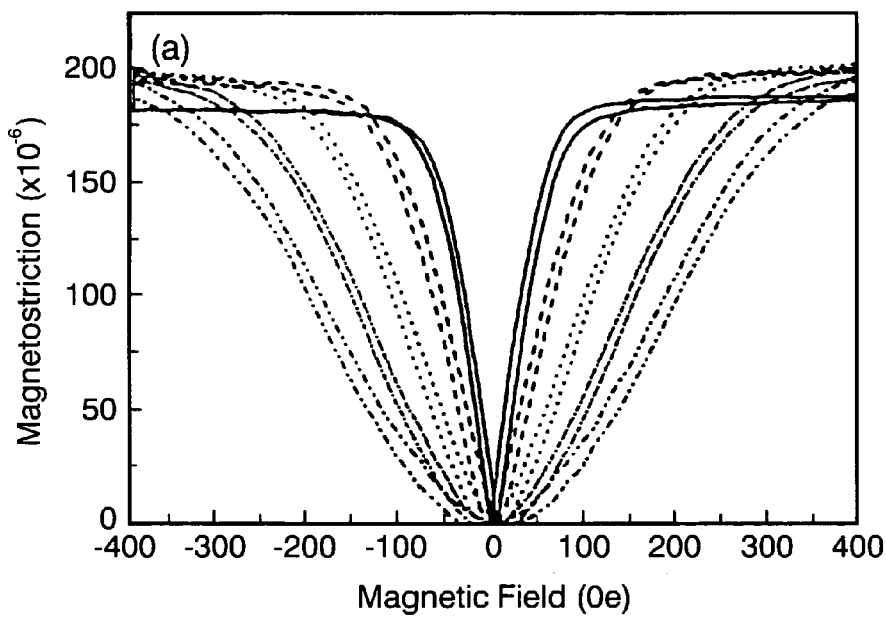
Figure 5B:
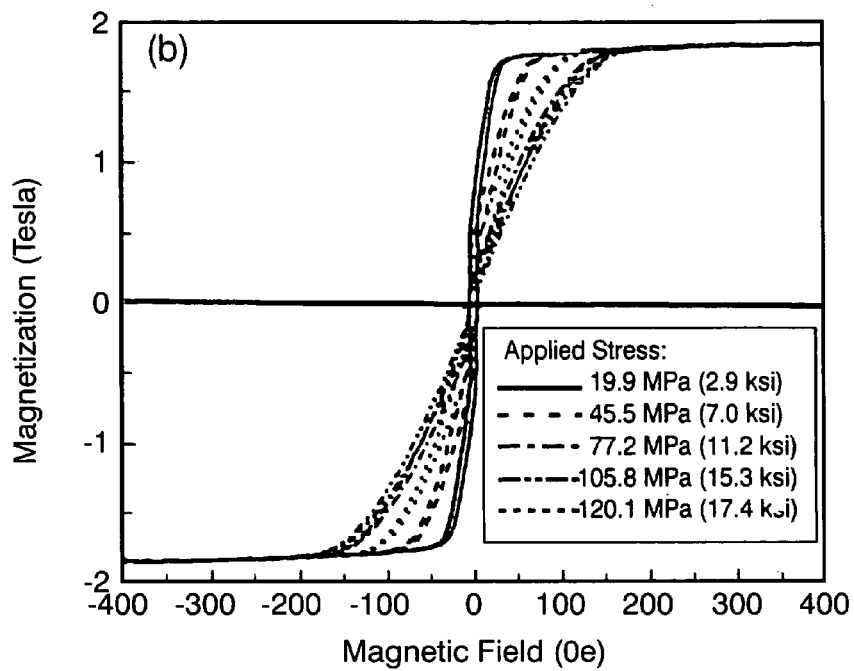
FIG. 5a and FIG. 5b show room temperature magnetostriction and magnetization, respectively, along the [100] axis of $Fe_{87}Ga_4Al_9$ as a function of internal magnetic field (H) for compressive loadings of 19.9 to 120.1 MPa. The internal field (H) was calculated using a demagnetization factor of N=0.0067.

FIG. 4a illustrates the fractional change in length of [100] single crystal $Fe_{79}Ga_{21}$ in fields up to 400 Oe and compressive stresses up to 145.8 MPa (magnetostriction of approximately 160 ppm, at 6.8 MPa, field of 400 Oe. While the field dependencies in FIGS. 4a and 4b resemble those of $Fe_{87}Ga_{13}$ in FIG. 3a and FIG. 3b, both the saturation magnetostriction and magnetization are lower. A maximum room temperature magnetostriction in the binary $Fe_{100-x}Ga_x$ appears between 15 and 21 at % and another appears between 24 and 35 at %.

Figure 5A:
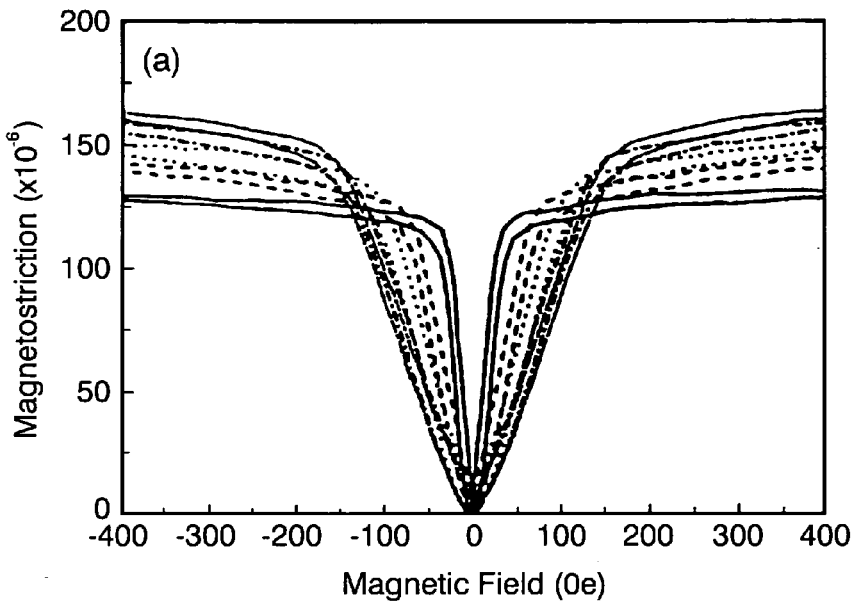

FIG. 5a (magnetostriction of approximately 125 ppm, 19.9 MPa, 400 Oe) illustrates the fractional change in length of [100] single crystal $Fe_{87}Ga_4Al_9$ in fields up to 400 Oe and compressive stresses up to 120.1 MPa. Replacing Ga with some Al decreases the magnetostriction. Because the magnetostriction is lower in this alloy than that in the binary Fe—Ga alloy of FIG. 4a, the magnetic fields required for saturation are lower and permeabilities are larger.

Figure 6:
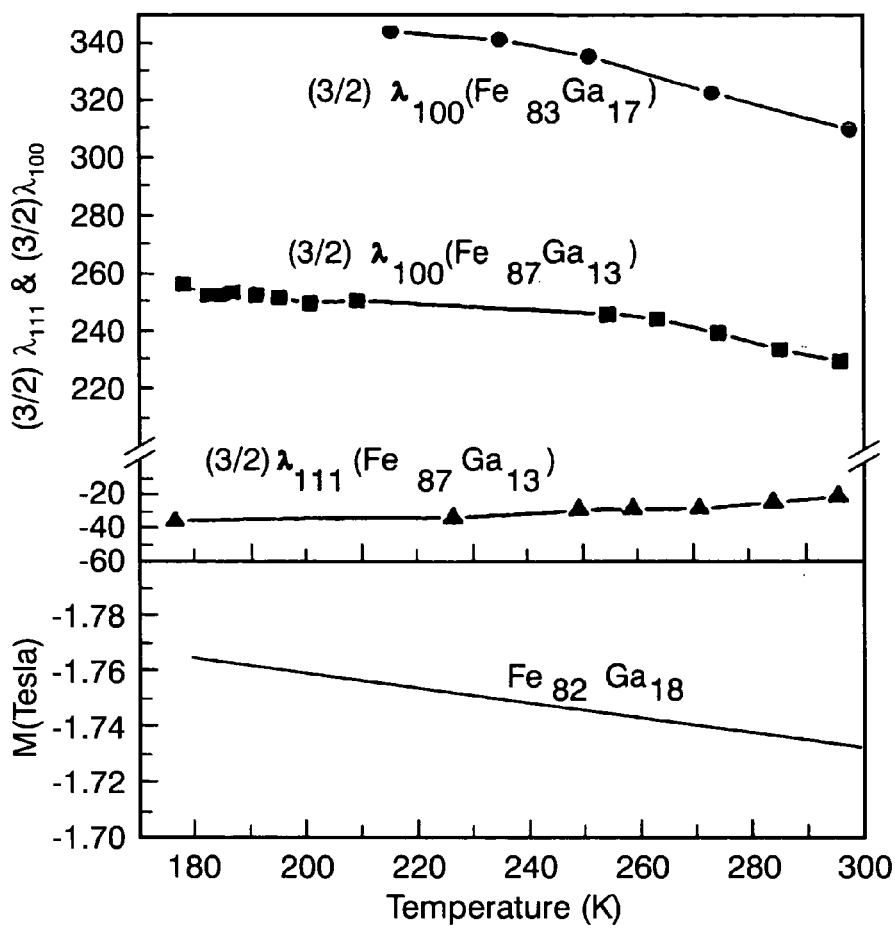
FIG. 6 shows $(3/2)\lambda_{100}$ and $(3/2)\lambda_{111}$ as a function of temperature for $Fe_{87}Ga_{13}$ and $(3/2)\lambda_{100}$ as a function of temperature for $Fe_{83}Ga_{17}$ at H=20 kOe. Some magnetization data for $Fe_{82}Ga_{18}$ was taken from Kawamiya et al. in *Phys. Soc. Japan* 33, (1972), 1318-1327.

Temperature Dependence of the Saturation Magnetostriction Constants from 180° K to Room Temperature Thin (100) discs of the single crystal samples were cut from larger crystals and mounted in a cryostat for measurements of the saturation magnetostriction constants below room temperature. Constantan foil strain gages were attached along the [100] direction for the measurement of $\lambda_{100}$. Magnetostrictions measured as a function of angle between the strain gage direction and magnetic field direction showed that the magnetostriction indeed follows the simple $\cos^2 \theta$ angular dependence within ~1%. No higher order terms were evident. FIG. 6 shows the temperature dependence of the magnetostriction constants from 180° K to room temperature at 20 kOe. It should be noted that the maximum magnetostriction is not given by the symbol $\lambda_{100}$ but by the symbol 3/2 ($\lambda_{100}$). Also plotted on the figure is the temperature dependence of the saturation magnetization for a b.c.c. $Fe_{82}Ga_{18}$ alloy, taken from Kawamiya, N., K. Adachi, and Y. Nakamura in *J. Phys. Soc. Japan* 33, (1972), 1318-1327. Some room temperature magnetostriction constants for various Fe-based alloys are compared in Table II.

TABLE II

ROOM TEMPERATURE VALUES OF $\lambda_{100}$ FOR SOME FE-BASED ALLOYS

| Atomic % in Fe | $\lambda_{100}$ (×10⁻⁶) |
|---|---|
| $Fe_{83}Ga_{17}$ | 207 |
| $Fe_{87}Ga_{13}$ | 153 |
| $Fe_{84}Al_{16}$* | 86 |
| $Fe_{84.4}Cr_{15.6}$* | 51 |
| $Fe_{84.4}V_{15.6}$* | 43 |

*Taken from R. C. Hall, *J. Appl. Phys.* 30, (1959) 816-819 and *J. Appl. Phys.* 31 (1960), 1037-1038.

Elastic Moduli and Magnetoelastic Energies

In order to determine the magnitude of the magnetoelastic energy as well as to evaluate the technological usefulness of this alloy system, it is important to know some elastic moduli, in particular Young's modulus, Poisson's ratio, and the shear elastic constant, $c_{11}-c_{12}$. Note that the lowest order magnetoelastic energies for cubic crystals is given by: $b_1=-(3/2)(c_{11}-C_{12})\lambda_{100}$ and $b_2=-3c_{44}\lambda_{111}$. Clearly, for these Fe-based alloys, $b_1$ represents the major magnetoelastic component.

For [100] oriented magnetostrictive rods, the elastic constants $c_{11}$ and $c_{12}$ can be calculated from Poisson's ratio (p) and Young's modulus (Y) measurements through the following relationships:

$$c_{11}=[(1-p)/(1+p)(1-2p)]Y \text{ and}$$

$$c_{12}=[p/(1+p)(1-2p)]Y,$$

from which: $c_{11}-c_{12}=Y/(1+p)$.

Young's modulus and Poisson's ratio were measured as a function of magnetic field on a sample of $Fe_{85}Ga_{15}$ at room temperature. The stiff (low field, high stress) Young's modulus is ≈ 77 GPa and Poisson's ratio is ≅0.38. Magnetoelastic energies and moduli for $Fe_{83}Ga_{17}$, $Fe_{84}Al_{16}$, $Fe_{96}Al_4$ and Fe are compared in Table III.

TABLE III

ELASTIC AND MAGNETOELASTIC CONSTANTS AT ROOM TEMPERATURE.

| | $(3/2)\lambda_{100}$ $(\times 10^{-6})$ | $c_{11}-c_{12}$ (GPa) | $B_1$ $(\times 10^6 \text{ J/m}^3)$ |
|---|---|---|---|
| $Fe_{83}Ga_{17}$ | 311 | 56* | −17 |
| $Fe_{84}Al_{16}$** | 129 | 65 | −8.4 |
| $Fe_{96}Al_4$** | 36 | 88 | −3.2 |
| Fe** | 30 | 96 | −2.9 |

*From $Fe_{85}Ga_{15}$ sample,
**Hall, R. C., J. Appl. Phys. 30, (1959) 816-819 and J. Appl. Phys. 31 (1960), 1037-1038; Leamy, H., E. D. Gibson and F. X. Kayser, Acta Metallurgica, 15, (1967), 1827-1837,
***From Hall, R. C., J. Appl. Phys. 30, (1959) 816-819 and J. Appl. Phys. 31 (1960), 1037-1038, and Mason, W. P., Physical Acoustics and the Properties of Solids, D. Van Nostrand Publ. Co., New York (1958), p. 358

Hardness and Tensile Strength

Figure 7:
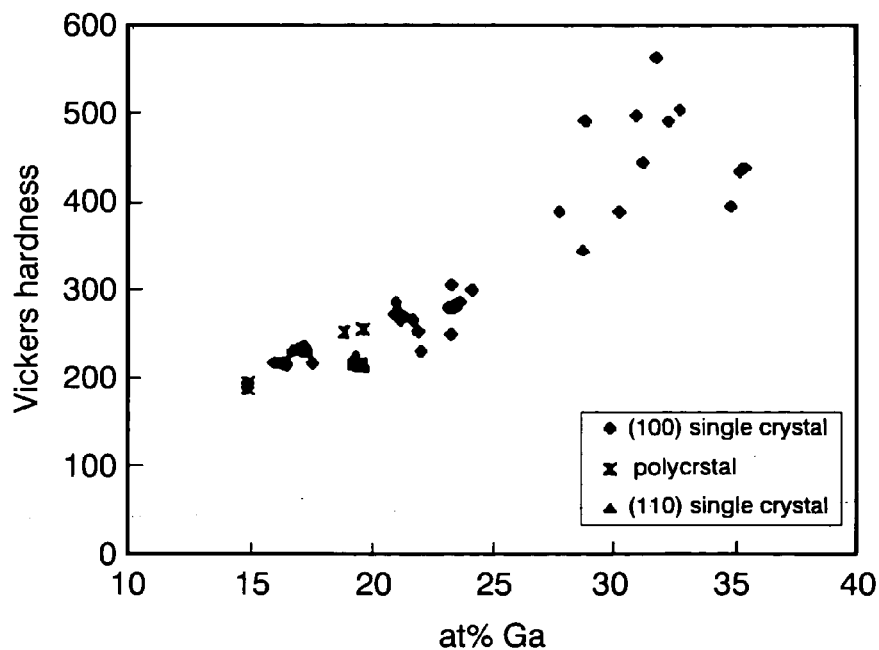
FIG. 7 shows the Vickers hardness for a FeGa based alloy according to the present invention.

The addition of Ga to Fe was found to increase the hardness of both polycrystal and single crystal samples. Vicker's hardness values calculated from measurements taken on alloys of $Fe_{100-x}Ga_x$ for 15<x<35 are shown in FIG. 7. For the magnetostrictive materials described in the above sections, where x is between 15 and 21, the hardness ranges between 200 and 250. These values imply rugged, moderately ductile material with tensile strengths ~700 MPa (100,000 psi).

Polycrystalline Alloys

These examples show that inexpensive processing conditions may be used to obtain material with preferred [100] crystallographic texture direction along which maximum magnetostriction can be obtained.

A specimen, e.g., $Fe_{83}Ga_{17}$, was produced by a 96% hot and warm rolling reduction of an as-cast ingot. A disk specimen, 7.9 mm in diameter, was punched from the rolled material, having a thickness of 0.38 mm. A subsequent anneal of the disk for 5 hr at 1000° C. induced secondary recrystallization and produced through-thickness grains with diameters up to approximately 400 μm. Orientation imaging microscopy (OIM) was used to map each grain and its crystallographic orientation.

The strain states of the disk were analyzed for changes in the direction of the saturation magnetostriction vector from transverse to parallel with the rolling direction. The FEM simulations indicated $\Sigma_{tot,\|-\perp}=177\pm 3$ ppm relative to the rolling direction; this falls between the measurements of 160-180 ppm collected in separate strain gauge installations. It should be noted that the experimental results are sensitive to minor changes in gauge location due to the large grain sizes and their wide range of crystallographic orientation.

An as-cast ingot, e.g., $Fe_{83}Ga_{17}$, was reduced by 99% with hot, warm and cold rolling to a final thickness of 0.10 mm. A disk-shaped specimen of the material, 7.9 mm in diameter, was then annealed at 590° C. for 1 h to affect stress relief without secondary recrystallization.

Rolling

The textured Fe—Ga alloys could be made using the rolling processing method and may provide an inexpensive and very attractive alternative to existing rare earth based giant magnetostrictive materials. They would be cheaper than corresponding single crystal or directional growth textured materials and could be produced in larger quantities. A sequence of hot rolling, two-stage warm rolling with intermediate anneals should produce an iron gallium polycrystalline alloy material with [100] preferred orientation. Orientation imaging microscopy (OIM) technique was used to examine the evolution of texture.

A rolling procedure was as follows:
1. Enclosed ingot in 321 stainless steel can, preoxidized to 900° C. in air to prevent bonding between ingot and can.
2. Hot soaked the ingot at 1000° C. for 30 min and hot rolled 55% total reduction in thickness by multiple passes of 0.003" with intermediate re-heating to 1000° C. after 3 passes.
3. Removed ingot from can.
4. Annealed at 700° C. for 1 hour in dry argon atmosphere followed by 2.5 hours at 300° C.
5. Warm rolled at 300° C. for a total reduction of 60% by multiple passes of 0.003" with intermediate re-heating at 300° C. after every 3 passes.
6. Annealed at 700° C. for 30 min in dry argon atmosphere followed by 10 min at 300° C.
7. Warm rolled at 300° C. for a total reduction of 24% by multiple passes of 0.002" with intermediate re-heating to 300° C. after every 2 passes.
8. Warm rolled at 300° C. for a total reduction of 42% multiple passes of 0.002" with intermediate re-heating to 300° C. after every 2 passes.
9. Annealed at 700° C. for 30 min in dry argon atmosphere followed by 10 min at 300° C.
10. Warm rolled at 300° C. for a total reduction of 50% by multiple passes of 0.001" with intermediate re-heating to 300° C. after every 2 passes.
11. Annealed at 475° C. for 3 hours in dry argon atmosphere followed by 4 hours at 1100° C. and furnace cool over 8 hours.

This process results in a structure consisting of through-thickness grains and measured magnetostriction of 160 ppm in the RD.

Obviously, many modifications and variations of the present invention are possible in light of the above teachings. It is therefore to be understood that, within the scope of the appended claims, the invention may be practiced otherwise than as specifically described.

What is claimed is:

1. A device for converting magnetic energy into mechanical energy, the device comprising:
   a magnetic field generator; and
   magnetostrictive iron alloy subject to a magnetic field generated by said magnetic field generator, said magnetostrictive iron alloy comprising one of $Fe_{85}Ga_{15}$, $Fe_{83}Ga_{17}$, and $Fe_{79}Ga_{21}$, wherein said alloy is a single crystal having a [100] orientation, said single crystal orientation providing a room temperature magnetostriction of at least 150 ppm; and wherein said magnetic field, generates a change in dimension of said alloy.

2. An alloy comprising:

a magnetostrictive iron alloy comprising one of $Fe_{85}Ga_{15}$, $Fe_{83}Ga_{17}$, and $Fe_{79}Ga_{21}$, wherein said magnetostrictive iron alloy is a single crystal having a [100] orientation, said single crystal orientation providing a room temperature magnetostriction of at least 150 ppm.

3. A magnetostrictive iron alloy for converting magnetic energy into mechanical energy, the magnetostrictive iron alloy comprising $Fe_{87}Ga_4Al_9$, wherein said $Fe_{87}Ga_4Al_9$ is a single crystal with a [100] orientation, said single crystal orientation providing a room temperature magnetorestriction of about 150 ppm.

4. A device for converting magnetic energy into mechanical energy, the device comprising:

a magnetic field generator; and a magnetostrictive iron alloy subject to a magnetic field generated by said magnetic field generator, said alloy comprising $Fe_{87}Ga_4Al_9$, wherein said $Fe_{87}Ga_4Al_9$ is a single crystal with a [100] orientation, said single crystal orientation providing a room temperature magnetorestriction of about 150 ppm.

5. The device for converting magnetic energy into mechanical energy of claim 1, wherein said magnetostrictive iron alloy comprises $Fe_{79}Ga_{21}$ and said crystal orientation provides a room temperature magnetostriction of about 200 ppm.

6. The alloy of claim 2, wherein said magnetostrictive iron alloy comprises $Fe_{79}Ga_{21}$ and said crystal orientation provides a room temperature magnetorestriction of about 200 ppm.

* * * * *